United States Patent [19]

Shiozawa et al.

[11] Patent Number: 6,061,174
[45] Date of Patent: May 9, 2000

[54] IMAGE-FOCUSING OPTICAL SYSTEM FOR ULTRAVIOLET LASER

[75] Inventors: Masaki Shiozawa, Sagamihara; Tsutomu Mizugaki, Matsudo; Shigeru Sakuma, Chigasaki; Norio Komine; Seishi Fujiwara, both of Sagamihara; Hiroki Jinbo, Yokohama, all of Japan

[73] Assignee: Nikon Corporation, Tokyo, Japan

[21] Appl. No.: 09/040,663

[22] Filed: Mar. 18, 1998

[30] Foreign Application Priority Data

Mar. 18, 1997 [JP] Japan .................................. 9-064489

[51] Int. Cl.[7] .............................. G02B 5/20; G02B 13/14; G02B 27/42; F21V 9/06
[52] U.S. Cl. .......................... 359/361; 359/350; 359/355; 355/53
[58] Field of Search ..................... 359/350, 355, 359/356, 361, 731; 313/636; 355/53, 46

[56] References Cited

U.S. PATENT DOCUMENTS

| | | | |
|---|---|---|---|
| 5,260,578 | 11/1993 | Bliton et al. .............................. | 359/350 |
| 5,515,207 | 5/1996 | Foo .......................................... | 359/731 |
| 5,631,522 | 5/1997 | Scott et al. ............................... | 313/636 |

OTHER PUBLICATIONS

Birsoy, R., Coloring of Synthetic Fluorite, Phys. Stat. Sol. (A) 62, 169 (1980).

Cope, D. R., UV Lasers Require Tough Transmissive Materials, Laser Focus World, Jan. 1992.

Krajnovich, D. J., Testing of the Durability of Single–Crystal Calcium Fluoride With and Without Antireflection Coatings For Use With High–Power KrF Excimer Lasers, Applied Optics, vol. 31, No. 28, Oct. 1, 1992.

*Primary Examiner*—Audrey Chang
*Attorney, Agent, or Firm*—Morgan, Lewis & Bockius LLP

[57] ABSTRACT

An optical member is provided for use in an image-focusing optical system for guiding light having a wavelength shorter than about 300 nm. The optical member includes a calcium fluoride crystal having a sodium concentration of less than about 0.2 ppm.

19 Claims, 4 Drawing Sheets

IMAGE-FOCUSING OPTICAL SYSTEM FOR ULTRAVIOLET LASER

This application claims the benefit of Japanese Application No. 09-064489, filed in Japan on Mar. 18, 1997, which is hereby incorporated by reference.

This application hereby incorporates by reference Japanese Application No. 08-153769, filed in Japan on Jun. 14, 1996.

BACKGROUND OF THE INVENTION

1. Field of the Invention

The present invention relates to an apparatus that uses light with a wavelength of 300 nm or less as a light source. Such an apparatus includes an image-focusing optical system that can be installed in various apparatases, such as dn ArF excimer laser lithographic apparatus, ArF excimer laser CVD apparatus, and ArF excimer laser machining apparatus, etc. The present invention also relates to light-transmitting optical members, such as lenses, prisms and windows, etc., which con be incorporated into these optical systems. The present invention further relates to a projection exposure apparatus that uses light with a wavelength of 300 nm or less as a light source, and more particularly, to a projection exposure apparatus that uses an ArF excimer laser as a light source.

2. Discussion of the Related Art

Conventionally, reduction projection type exposure apparatuses known as "steppers" have been used in photolithographic techniques in which fine patterns of integrated circuits are exposed and transferred onto the surfaces of silicon wafers or the like. The optical systems of such steppers are constructed of an illumination optical system for uniformly illuminating the surface of a reticle (on which an integrated circuit pattern is drawn) with light from a light source, and a projection optical system for projecting and transferring the integrated circuit pattern of the reticle onto the surface of the wafer with a reduction ratio of one-fifth of the reticle pattern size, for example. Such apparatuses that use light to transfer integrated circuit patterns onto the surfaces of wafers are collectively referred to as "photolithographic apparatuses". With the increased integration of the LSI in recent years, a increase in the resolution of the transferred patterns on the wafer has become necessary. The resolution of the transfer pattern is proportional to the inverse of the wavelength of the light from the light source and to the numerical aperture of the projection optical lens system. Accordingly, a higher resolution can be obtained by increasing the numerical aperture and/or shortening the wavelength of the light source.

However, due to various limitations imposed on the lens manufacture, it is difficult to increase the numerical aperture of lenses. Accordingly, the wavelength of the light source has been reduced to increase the resolution. For example, in the light sources of steppens, the wavelength has been shortened to the g-line (436 nm), i-line (365 nm), and even further to KrF (249 nm) and ArF (193 nm) excimer laser beams. Especially, in order to manufacture the VLSIs, such as DRAMs with the memory capacities of 64 MB, 256 MB, 1 GB, 4 GB or greater, it is necessary to reduce "the line-and-space value" (which is an indicator of the resolution of steppers) to 0.3 $\mu$m or less. In such cases, it is necessary to use ultraviolet or vacuum ultraviolet light with a wavelength of 250 nm or less, such as excimer laser beams, as a light source.

In general, optical glass materials that have been used in the lens members of the illumination optical system and the projection optical system of a stepper with a light source having a wavelength longer than that of the blind exhibits an abrupt drop in light transmissivity in the wavelength shorter than the i-line. In particular, almost all such optical glass materials cease to transmit light in the wavelength shorter than 250 nm. For this reason, silica glass, which has a high transmissivity at that short wavelength region and is suitable for obtaining optical members having an large diameter and high homogeneity in the refractive index, is effective as an optical glass material for use in the optical systems of steppers using excimer lasers as light sources. Furthermore, among other crystal materials, the uses of lithium fluoride crystals, magnesium fluoride crystals, and calcium fluoride crystals are conceivable. The calcium fluoride crystals are especially suitable, because the calcium fluoride crystals have a high transmissivity in the light region extending from ultraviolet to vacuum ultraviolet light and are also optically isotropic. Furthermore, the calcium fluoride crystals can be grown to a large crystal suitable for the manufacture of bigger lenses.

Conventional calcium fluoride crystals exhibit a high durability in light transmissivity with respect to a KrF excimer laser (a favorable characteristic for use with a KrF excimer laser) and are therefore usable for optical systems having a high power KrF excimer laser as a light source. The details of this property can be found in APPLIED OPTICS/ Vol. 32, No. 29/6062-6075/(1992).

These two optical materials, silica glass and calcium fluoride, are indispensable for correcting chromatic aberrations and monochromatic aberrations in image-focusing optical systems using light with a wavelength of 300 nm or less as a light source, such as ArF excimer laser light When silica glass and calcium fluoride crystals are used in the image-focusing optical system (such as the illumination optical systems or projection optical systems) of an ArF excimer laser lithographic apparatus (wavelength of 193 nm), the optical members need to have a high homogeneity in refractive index with little distortion and a high transmissivity in order to expose the integrated circuit pattern with a high resolution over a large area. For example, in projection optical systems, many lenses with different curvatures are necessary for correcting various aberrations. Therefore, the total optical path in the projection optical system may reach 1000 mm or greater in some cases. In illumination optical systems, although the total optical path is shorter than that for projection optical systems, the energy density of the illuminating ArF excimer laser light is high. Thus, a higher transmissivity is required in the lens members. To achieve a higher total transmissivity, each of the optical members need to have a sufficiently high bulk transmissivity.

The methods used to manufacture high-quality silica glass and calcium fluoride crystals used in the above-mentioned image-focusing optical systems are described below.

For silica glass, a vapor phase synthesizing method known as "direct method" is used. Silica glass manufactured using this method is particularly known as "synthetic silica glass". In this direct method, a silicon compound with a high purity, such as silicon tetrachloride, is used as a raw material. This raw material is hydrolyzed in oxygen-hydrogen flames, thus forming fine silica glass particles (soot). This soot is accumulated, melted, and is made transparent in a single, almost simultaneous process on the surface of a target that is rotated oscillated, and is pulled downward, thereby producing a silica glass ingot.

There have also been attempts to obtain silica glass with greater homogeneity by subjecting silica glass optical members produced by this synthesis method to a subsequent heat treatment at about 2000° C. In this case, since desired physical properties are obtained by performing a separate heat treatment, such a process is referred to as "secondary" in contrast to the primal process by which the silica glass is synthesized. This method has an advantage in that the synthesized glass has fewer metal impurities and therefore a higher purity than molten quart glass obtained by the electrical melting or flame melting of powdered natural quartz. Accordingly, the resultant glass has a high transmissivity in the ultraolet region at wavelengths of 250 nm or less, enabling the manufacture of silica glass optical members with a larger diameter and greater homogeneity.

On the other hand, high-quality calcium fluoride crystals can be obtained by means of the crucible lowering method (known as "Bridgeman method" or "Stockberger method"). in this method, large-diameter, high-quality single crystals can be grown by utilizing the temperature distribution inside a furnace and by pulling the crucible downward.

It has been assumed that even for ultraviolet laser image-focusing optical systems, such as the illumination optical systems and projection optical systems, of ArF excimer laser lithographic apparatuses, it should be possible to use synthetic silica glass or calcium fluoride crystals obtained by the conventional manufacturing methods above in order to obtain sufficiently high transmissivity.

In calcium fluoride crystals, the absorption end at the short wavelength side is 124 nm, so that calcium fluoride crystals should, in principle, be usable for the light range extending from ultraviolet to vacuum ultraviolet. In other words, calcium fluoride crystals for use in an optical system for a 248 nm KrF excimer laser could also be used as is for an optical system using a 193 nm ArF excimer laser as a light source. In actuality, however, calcium fluoride crystal irradiated with a high energy light beam from an ArF excimer laser exhibit drastic deterioration of the transmissivity.

The maximum energy density of the laser beam illuminating the optical members used in the image-focusing optical system of a reduction type projection exposure apply is approximately 100 mJ·cm$^{-2}$/pulse. At such a high energy density, conventional calcium fluoride crystals show a transmissivity drop of approximately 8% or large per unit centimeter. This means a considerable amount of the radiation energy is absorbed in the crystal. Furthermore, heat is generated in the lens resulting from the conversion of light energy into heat energy by such energy absorption. This in turn results in variations in the refractive index and microscopic deformations of the shape of the optical member, making the optical member no longer usable.

Similar problems occur for optical members made of silica glass; e.g., damage to the optical member becomes a serious problem when the energy density of the light illuminating the optical member is high.

SUMMARY OF THE INVENTION

Accordingly, the present invention is directed to an image-focusing optical system for an ultraviolet laser that substantially obviates the problems due to limitations and disadvantages of the related art.

An object of the present invention is to provide an optical member that has a high durability with respect to ArF excimer laser beams.

Another object of the present invention is to provide an image-focusing optical system that has a high total transmissivity.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides an optical member for use in an image-focusing optical system using light with a wavelength of 300 nm or less as a light source, the optical member including a calcium fluoride crystal with a sodium content of 0.2 ppm or less.

In another aspect, the present invention provides an optical member for use in an image-focusing optical system for guiding light having a wavelength shorter than about 300 nm, the optical member including a calcium fluoride crystal having a sodium concentration of less than about 0.2 ppm.

In another aspect, the present invention provides an image-focusing optical system for guiding light having a wavelength shorter than about 300 nm the image-focus optical system including a first optical member including a calcium fluoride crystal having a sodium concentration of less than about 0.2 ppm; and a second optical member optically coupled to the first optical member, the second optical member including silica glass having a sodium concentration of less than about 0.2 ppm.

In another aspect, the present invention provides an illumination optical system for use in an exposure apparatus to guide light having a wavelength shorter than about 300 nm towards a mask, the illumination optical system including a first optical member including a calcium fluoride crystal having a sodium concentration of less than about 0.1 ppm; and a second optical member optically coupled to the first optical member, the second optical member including silica glass having a sodium concentration of less than about 0.1 ppm.

In another aspect, the present invention provides a projection critical system for use in an exposure apparatus to project a circuit pattern on a reticle onto a substrate with light having a wavelength shorter tan about 300 nm, the projection optical system including a first optical member including a calcium fluoride crystal having a sodium concentration of less than about 0.1 ppm; and a second optical member optically coupled to the fist optical member, the second optical member including silica glass having a sodium concentration of less than about 0.1 ppm.

In another aspect, the present invention provides a projection exposure apparatus for projecting a mask pattern on a mask onto a substrate with exposing light having a wavelength shorter than about 300 nm, the projection exposure apparatus including an illumination optical system for guiding the exposing light towards the mask; and a projection optical system for guiding the exposing light that has passed through the mask towards the substrate to project the mask pattern onto the substrate, wherein at least one of the illumination optical system and the projection optical system includes a first optical member including a calcium fluoride crystal having a sodium concentration of less than about 0.2 ppm; and a second optical member optically coupled to the first optical member, the second optical member including silica glass having a sodium concentration of less than about 0.2 ppm.

In another aspect, the present invention provides a calcium fluoride crystal to be cut out to form an optical member for processing a pulsed ArF excimer lower beam of a wavelength of 193 nm having a predetermined energy density E mJ·cm$^{-2}$ per pulse with a permissible drop in transmissivity Y % per unit centimeter, wherein a sodium concentration of the calcium fluoride crystal in the unit of ppm is substantially equal to or less than a numerical value Na determined by the following equation, $$Na = \frac{Y}{0.25 \cdot E}.$$

In another aspect, the present invention provides an optical member for processing a pulsed ArF excimer laser beam of a wavelength of 193 nm having a predetermined energy density E mJ·cm$^{-2}$ per pulse with a permissible drop in transmissivity Y % per unit centimeter, the optical member comprising a calcium fluoride crystal having a sodium concentration in the unit of ppm substantially equal to or less than a numerical value Na determined by the following equation, $$Na = \frac{Y}{0.25 \cdot E}.$$

In another aspect, the present invention provides a method for growing a calcium fluoride crystal having a sodium concentration of less than about 0.2 ppm to be used for an optical member of an image-focusing optical system that processes light having a wavelength shorter than about 300 nm the method including the steps of (a) performing a pre-treatment including the steps of mixing a calcium fluoride raw material and a scavenger in a crucible to form a mixture thereof, heating the crucible at a temperature higher than the melting point of calcium fluoride to produce a melt of the mixture, and pulling the crucible downward to gradually crystalize the melt from a lower portion of the melt to produce a pre-treated material; and (b) performing a crystal growth including the steps of melting the pre-treated material at a temperature higher than he melting point of calcium fluoride in a crucible to produce a melt of the pre-treated material, and pulling the crucible downward to gradually crystallize the melted pre-treated material to produce the calcium fluoride crystal.

In a further aspect, the present invention provides a method for growing a calcium fluoride crystal having a sodium concentration of less than about 0.2 ppm to be used for an optical member of an image-focusing optical system that processes light having a wavelength shorter than about 300 nm, the method including the steps of (a) performing a pre-treatment including the steps of mixing a calcium fluoride raw material and a scavenger in a crucible to form a mixture thereof, hewing the crucible at a predetermined temperature below the melting point of calcium fluoride to initiate a reduction reaction in the mixture therein, heating the crucible at a temperature higher than the melting point of calcium fluoride to produce a melt of the mixture, and pulling the crucible downward at a first predetermined pull rate to gradually cool and crystallize the melt from a lower portion of the melt to produce a purified material; and (b) performing crystal growth including the steps of melting the purified material at a temperature higher than the melting point of calcium fluoride in a crucible to produce a melt of the purified material, and pulling the crucible downward at a second predetermined pull rate to gradually cool and crystallize the melted purified material to produce the calcium fluoride crystal, wherein the first and second pull rates are determined in such a way as to produce the calcium fluoride crystal having the sodium concentration of less than about 0.2 ppm.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification illustrate embodiments of the invention and together with the description serve to explain the principles of the invention.

In the drawings.

DETAILED DESCRIPTION OF THE PREFERRED EMBODIMENTS

Figure 1:
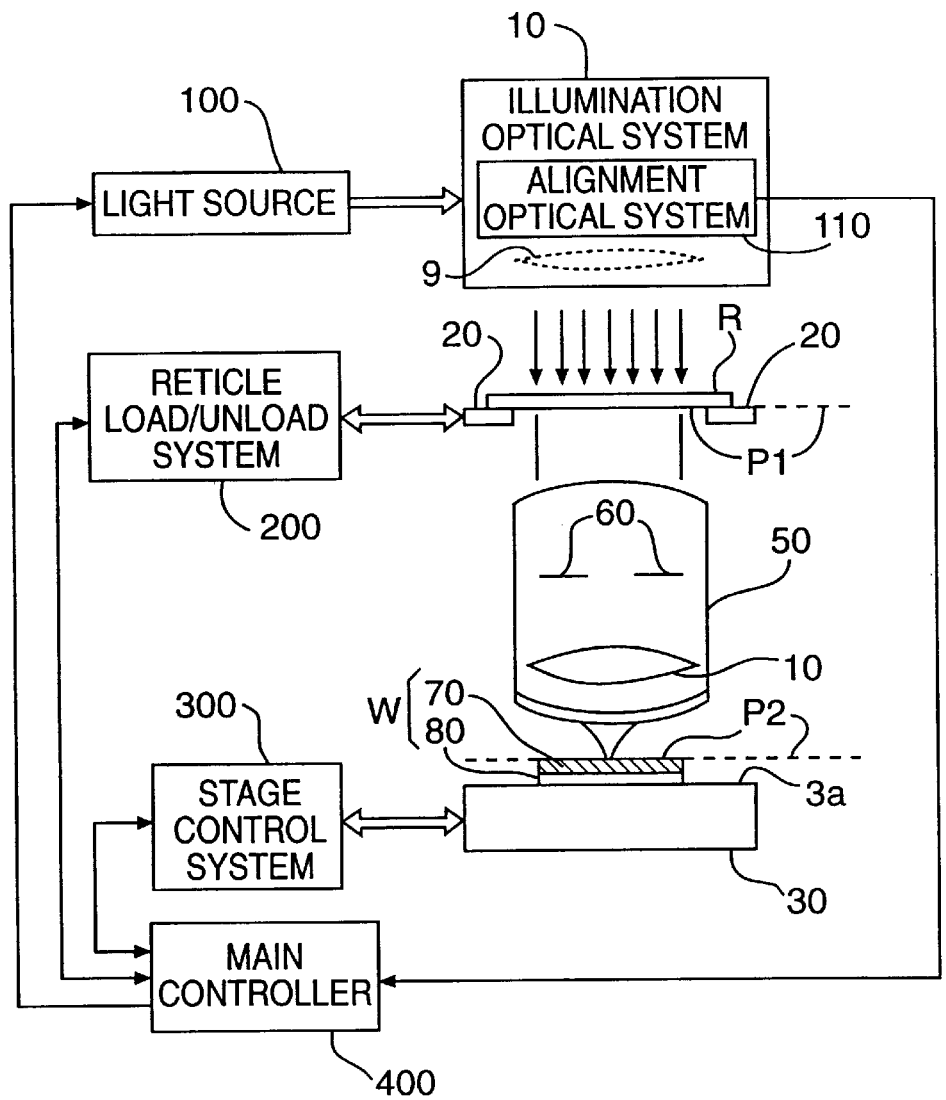
FIG. 1 is a schematic view of an exposure apparatus to which an image-focusing optical system of the present invention is applied.

Reference will now be made in detail to the preferred embodiments of the present invention, examples of which are illustrated in the accompanying drawings.

Before discussing preferred embodiments and working examples of he present invention, the results of our studies and experiments that have led to the present invention are described first.

The present inventors first focused on the concentrations of metal impurities in the optical members. It has long been known that if a large number of metal impurities are contained in the optical members, the transmission characteristics of the optical members with respect to ultraviolet light deteriorate. However, with respect to light with the wavelength 193 nm, which is the wavelength of an ArF excimer laser, there has been no elucidation as to which impurity governs the absorption phenomena the most, how the internal absorption is caused by the irradiation, or as to how this affects the total transmissivity (throughput) of the optical system.

As a result of diligent research, the present inventors discovered that the total transmissivity (throughput) of an image-focusing optical system depends primarily on the contents of Na in the respective optical members. Furthermore, the present inventors discovered that even if an image-focusing optical system is constructed from different materials, i.e., silica glass and calcium fluoride crystals, the total transmissivity of the resultant optical system can be regulated by adjusting the content of a single impurity element Na for both. cases. Moreover, it was found that synthetic silica glass and calcium fluoride crystals have significantly different transmissivity behaviors with each other when irradiated with ultraviolet light independently, but the total transmissivity of the resultant image-focusing optical system can nonetheless be regulated largely on the basis of the Na content In particular, it was found that even if the calcium fluoride crystals contain impurities (Sr, for example) other than Na at the concentration ranging from several tens of ppm to several hundreds ppm, the total transitivity (throughput) with respect to ArF excimer laser light still depends primarily on the Na concentration (which is typically in the order of 0.1 ppm). That is, a high total transmissivity (throughput) with respect to ArF excimer laser light can be achieved by lowering the Na content.

Accordingly, the present invention provides an optical member that includes a calcium fluoride crystal with a sodium content of about 0.2 ppm or less for use in an image-focusing optical system using light with a wavelength of about 300 nm or less as a light source.

Furthermore, the present invention provides an image-focusing optical system including optical members containing calcium fluoride crystals and optical members containing silica glass, for use with light of a wavelength of about 300 nm or less from a light source, in which the respective sodium contents of the calcium fluoride crystals and the silica glass arc each about 0.1 ppm or less.

In the present invention, various samples made of silica glass and/or calcium fluoride crystals were prepared, and the effects of the impurity concentrations of the optical members on the total transmissivity (throughput) of the image-focusing optical system were investigated. It was discovered that even in the case of combinations of different materials, i.e., silica glass and calcium fluoride crystals, the primary factor that governs the total transmissivity (throughput) of the image-focusing optical system is the concentration of an impurity Na in the optical members. This discovery led to the present invention, as follows.

In the past, even when optical systems were manufactured using synthetic silica glass and calcium fluoride crystals, which supposedly have high purity, it was fequently found that the overall tansmissivity of the optical system was extremely poor when ArF excimer laser light actually passed through the optical system. Accordingly, it was difficult to construct an image-focusing optical system having a high total transmissivity (throughput). The present inventions discovered that there are at least two reasons for this difficulty.

First, it was unclear which impurity is the dominant factor for the absorption, and to what extent (in quantitative terms) such an impurity affects the absorption rate. It had long been known that the transmission characteristics for ultraviolet light deteriorates if a large number of metal impurities are present in the optical members. However, especially for light at 193 nm, which is the wavelength of the ArF excimer laser, it was unclear which impurity dominates the absorption, and quantitatively to what extent such an impurity affects the transmission characteristics.

Secondly, the physical characteristics of synthetic silca glass and calcium fluoride crystals under actual irradiation of ArF excimer laser light are significantly different from the characteristics observed by spectrophotometer measurements. When the transmissivity of synthetic silica glass and calcium fluoride crystals, which each supposedly have high purity, are measured using commercially available spectrophotometers, the results indicate a high transmissivity even at 193 mm (which is the wavelength of an ArF excimer laser). However, the transmissivity (throughput) during actual irradiation with an ArF excimer laser is completely different from the initial transmissivity measured using the spectrophotometers. Furthermore, the behavior of the characteristics in response to the actual irradiation of the ArF laser beams considerably differs between synthetic silica glass and calcium fluoride crystals.

The transmissivity behavior immediately after the initiation of ArF excimer laser irradiation will be described next. In the manufacture of conventional image-focusing optical systems, highly pure materials, which have a small absorption rate at the wavelength of the ultraviolet laser, are selected so that the resulting optical system has a high total transmissivity (throughput). In such cases, the presence or absence of absorption is evaluated by measuring the transmissivity of the optical members beforehand using a commercially available spectrophotometer. In general, the intensity of the probing light source used in such a spectrophotometer is small, e.g., in the order of nW (1 nW=$10^{-9}$ W) or less especially in the ultraviolet range. Furthermore, the probing light is continuous light. Accordingly, such measurements are not likely to alter the physical properties of the optical materials measured.

On the other had, in an actual image-focusing optical system, the optical materials are irradiated with a high power ultraviolet pulsed laser beam. In the case of an ArF excimer laser beam, the energy per pulse ranges from 1 $\mu J$ to as much as several joules. Since the pulse width of the ArF excimer laser is typically 10 to 20 ns, the optical members are irradiated with the high energy beam in this short period of time. If the light source energy of the spectrophotometer is calculated in terms of the energy applied during such an interval of 10 to 20 ns, the resuming value is on the order of $10^{-17}$ joules or less. Thus, as compared with this energy, the energy of the ultraviolet laser light radiating the image-focusing optical system is extremely large, and therefore it is conceivable that such high energy beams cause changes in the physical properties of the optical materials.

Furthermore, in the case of an actual ArF excimer laser lithographic apparatus, the apparatus is operated at a pulse frequency of several hundred Hz. Thus, the optical materials are irradiated with ArF excimer laser pulses each having the above-mentioned energy at a repetition frequency of several hundred Hz. Accordingly, over a period of several tens of seconds to several minutes after the initiation of ArF excimer laser irradiation, the physical properties of the optical materials deviate from the respective initial values before the irradiation In particular, the total transmissivity (throughput) of an actual image-focusing optical system during ArF excimer laser irradiation becomes completely different from the total transmissivity (throughput) that is predicted from the transmissivity vale measured by the spectrophotometer prior to the irradiation.

The present inventors conducted extensive research on these fluctuations in transmissivity immediately after the initiation of ArF excimer laser irradiation for both synthetic silica glass and calcium fluoride crystals. Then, the inventors found that these materials show completely different transmissivity behaviors.

First, various samples of synthetic silica glass were tested. It was found that when synthetic silica glass was irradiated with the ArF excimer laser beam, the tansmissivity increased until approximately $10^4$ pulses were radiated. Then, the transmissivity remained more or less constant Accordingly, the transmissivities in the pulse number range of $10^4$ to $10^5$ pulses were measured and regarded as the total transmissivity (throughput) during irradiation. It was found hat the measured transmissivities during irradiation are higher by several percent to several tens of percent than the respective initial values measured by the spectrophotometer prior to irradiation. Furthermore, it was discovered that the amount of absorption during irradiation as calculated from the above-mentioned measured value of the transmissivity during irradiation, depends solely on the Na content. When the Na content dependence of the amount of absorption during irradiation was investigated, it was found that the absorption coefficient per unit Na concentration is 0.02 cm$^{-3}$/ppm. Here, the absorption coefficient is defined by:

ln[(transmissivity)/(theoretical transmissivity)]/(sample thickness), where the theoretical transmissivity is the transmissivity determined solely by surface reflection losses with the absorption inside the sample being regarded as zero. The spice reflection losses can be calculated from the refractive index of the sample.

Furthermore, it was found that the Na content dependence on the amount of absorption during irradiation is more or less independent of the energy density per pulse of the ArF excimer laser. Therefore, in order to obtain the bulk transmissivity of 99.8%/cm or greater of the optical members made of synthetic silica glass for the image-focusing optical system for use with an ArF excimer laser lithographic apparatus (i.e., in order to maintain the bulk absorption coefficient of 0.2%/cm=0.002 cm$^{-1}$ or less), it is sufficient that the Na content be about 0.1 ppm or less.

In the above experiments, the amount of absorption with respect to light of the wavelength of 193 rum measured by the spectrophotometer prior to irradiation with an ArF excimer laser was 0.48 cm$^{-1}$/ppm for Na, and 0.22 cm$^{-1}$/ppm for K (potassium). Other metal impurities were significantly below the detection limit (20 ppb) of the spectrophotometer for the synthetic silica glass In this respect, the synthetic silica glass can be said to be highly purified.

Next, calcium fluoride crystals were studied. Types of impurities in commercially available calcium fluoride crystals mainly are Na, Sr, Ba, Mg, Fe, Si, Mn and La However, even with these impurities in the samples, there was almost no bulk absorption with respect to light of a wavelength of 193 mn detected in the transmissivity measurements by a spectrophotometer prior to irradiation with an ArF excimer laser; i.e., the bulk absorption coefficient was below the detection limit of 0.001 cm$^{-1}$. However, when irradiation with an ArF excimer laser was initiated, the situation changed; the transmissivity rapidly dropped during a time interval from the initiation of irradiation to approximately 10$^4$ pulses and remained more or less constant after that. This is quite opposite to what was observed in the case of synthetic silica glass. So far, the terminal transmissivity has been measured up to 10$^8$ puses, and no significant fluctuation has been observed. Thus, it is highly likely that the terminal transmissivity is stable even with higher numbers of pulses. Therefore, the transmissivities in the range of 10$^4$ to 10$^5$ pulses were measured, and regarded as the total transmissivities (throughput) of the corresponding sample during irradiation.

The present inventors discovered that the amount of absorption during irradiation, as calculated from the above-mentioned measured value of the transmissivity during laser irradiation, depends primarily on the Na content (despite the fact that the transmissivity behavior immediately after the irradiation is quite opposite to what was observed in the case of synthetic silica glass). In this case, when the Na content dependence on the amount of absorption during irradiation was measured, the absorption coefficient per unit Na concentration was 0.24 cm$^{-1}$/ppm. The detailed data that have led to this discovery are shown in Table 1.

TABLE 1

| Sample Number | α (cm$^{-1}$) | Impurity concentrations (ppm) | | | | | | |
|---|---|---|---|---|---|---|---|---|
| | | Na | Sr | Ba | Mg | Fe | Si | Mn | La |
| No. 1 | <0.01 | 0.01 | 200 | <5 | <5 | <0.5 | 140 | 1 | 1 |
| No. 2 | 0.03 | 0.12 | 20 | <5 | <5 | <0.5 | 200 | 1 | 1 |
| No. 3 | 0.04 | 0.14 | 150 | <5 | <5 | <0.5 | 200 | 1 | 1 |
| No. 4 | 0.075 | 0.26 | 220 | <5 | <5 | <0.5 | 120 | 1 | 1 |
| No. 5 | 0.08 | 0.30 | <5 | <5 | <5 | <0.5 | <10 | <1 | <1 |

Table 1 shows the bulk absorption coefficients α (cm$^{-1}$) during ArF excimer laser irradiation, and the impurity concentrations for various calcium fluoride test samples Nos 1–5. As clearly seen from Table 1, it was found that the bulk absorption coefficient α during ArF excimer laser irradiation depends primarily on the Na concentration, and is independent of the concentrations of other impurities. The ArF excimer laser irradiation conditions in this experiment were as follows: the energy density per pulse=100 mJ·cm$^{-2}$/pulse; and the pulse repetition frequency=100 Hz.

Furthermore, for calcium fluoride crystals, it was found that although the bulk absorption coefficient a during ArF excimer laser irradiation depends primarily on the Na concentration as far as impurities are concerned, this absorption coefficient is proportion to the energy density per pulse of the ArF excimer laser beam. The value 0.24 cm$^{-1}$/ppm (per unit Na concentration) obtained for the bulk absorption coefficient α during ArF excimer laser irradiation is for an energy density per pulse of 100 ml·cm$^{-3}$/pulse. Accordingly, since the maximum energy density of the ArF excimer laser light inside the projection optical system of an ArF exerciser laser lithographic apparatus is 5 mJ/cm$^2$/p, this indicates that the bulk transmissivity of the calcium fluoride crystal optical members in such an image-focusing optical system can be maintained at 99.8%/cm or greater (i.e., that the internal absorption can be maintained at 0.2%/cm=0.002 cm$^{-1}$ or less), if the Na concentration is about 0.1 ppm or less. In the illumination optical system specially in the optical members adjacent to the emission outlet of the ArF excimer laser apparatus, the energy density reaches approximately 10 times as much as that for the projection optical system. Therefore, it is especially desirable that the Na content of the calcium fluoride crystal be 0.01 ppm or less for the optical members used in the illumination optical system.

It is not entirely clear why the total transmissivity (throughput) drops with irradiation of an ultraviolet laser beam when Na is admixed with a calcium fluoride crystal. However, the cause can be inferred on the basis of research performed by the present inventors, as follows.

First, it appears that in calcium fluoride crystals, Na atoms are incorporated in the form of Na$^+$ ions by substituting the Ca$^{2+}$ ions. Na$^+$ ions each have a net charge smaller than that of a Ca$^{2+}$ ion by one electron due to its electronic structure. Thus, the regions surrounding the incorporated Na$^+$ ions assume a state in which the charge balance is destroyed. Accordingly, one of the two F$^-$ ion cites located between the Na$^+$ ion and the surrounding Ca$^{2+}$ ions becomes vacant in order to compensate this local charge unbalance around the Na$^+$ ions. When the crystal is not irradiated with ultraviolet laser light, electrons are not trapped at the F$^-$ ion vacant cite. Thus, no additional absorption band that causes the drop in transmissivity appears. However, these regions have large geometrical distortion as compared to the surrounding ideal structure. Therefore, color centers or the like are formed upon high power ultraviolet laser irradiation.

The present inventors propose tat the following reason as to why other impurities, such as Sr and Ba, have no effect on the total transmissivity (throughput) after irradiation with an ultraviolet laser beam. Sr and Ba are respectively incorporated in a calcium fluoride crystals in the form of $Sr^{2+}$ ions and $Ba^{2+}$ ions by substituting the $Ca^{2+}$ ions. Accordingly, unlike $Na^+$ ions, these ions require no charge compensation. Therefore, the two $F^-$ ions cites located between the $Sr^{2+}$ ion (or $Ba^{2+}$ ion) and the $Ca^{2+}$ ions need not be vacant. As a result, these regions have almost no geometrical distortion relative to the surrounding ideal structure. Thus, undesirable color centers are not formed even with ultraviolet laser irradiation. When alkali metals, which form monovalent cations, are admixed with calcium fluoride crystals, these ions substitute calcium atoms and color centers are formed due to charge compensation. In other words, defects formed by the admixture of alkali metals become color centers that absorb visible light upon irradiation with ArF excimer laser beams, an the thus formed color centers in ton contribute to the drop in the transmissivity at 193 nm.

The concentration of color centers should be proportional to the absorption coefficient of the resulting characteristic absorption due to the color centers. Therefore, $$T=I/I_1=\exp(-\alpha N d). \tag{1}$$

Here, T is the transmissivity $I_1$ is The energy intensity of the incident light, I is the energy intensity of the transmitted light, $\alpha$ is a constant, N is the color center concentration, and d is the thickness of the sample being measured.

For a small transmissivity drop (i.e., when T is approximately equal to 1), defining $\Delta T$ as $$\Delta T=(I_r-I)/I_i, \tag{2}$$

then, $$\Delta T \sim \alpha N d. \tag{3}$$

Accordingly, the concentration of color centers is proportional to the amount by which the transmissivity drops.

Figure 5:
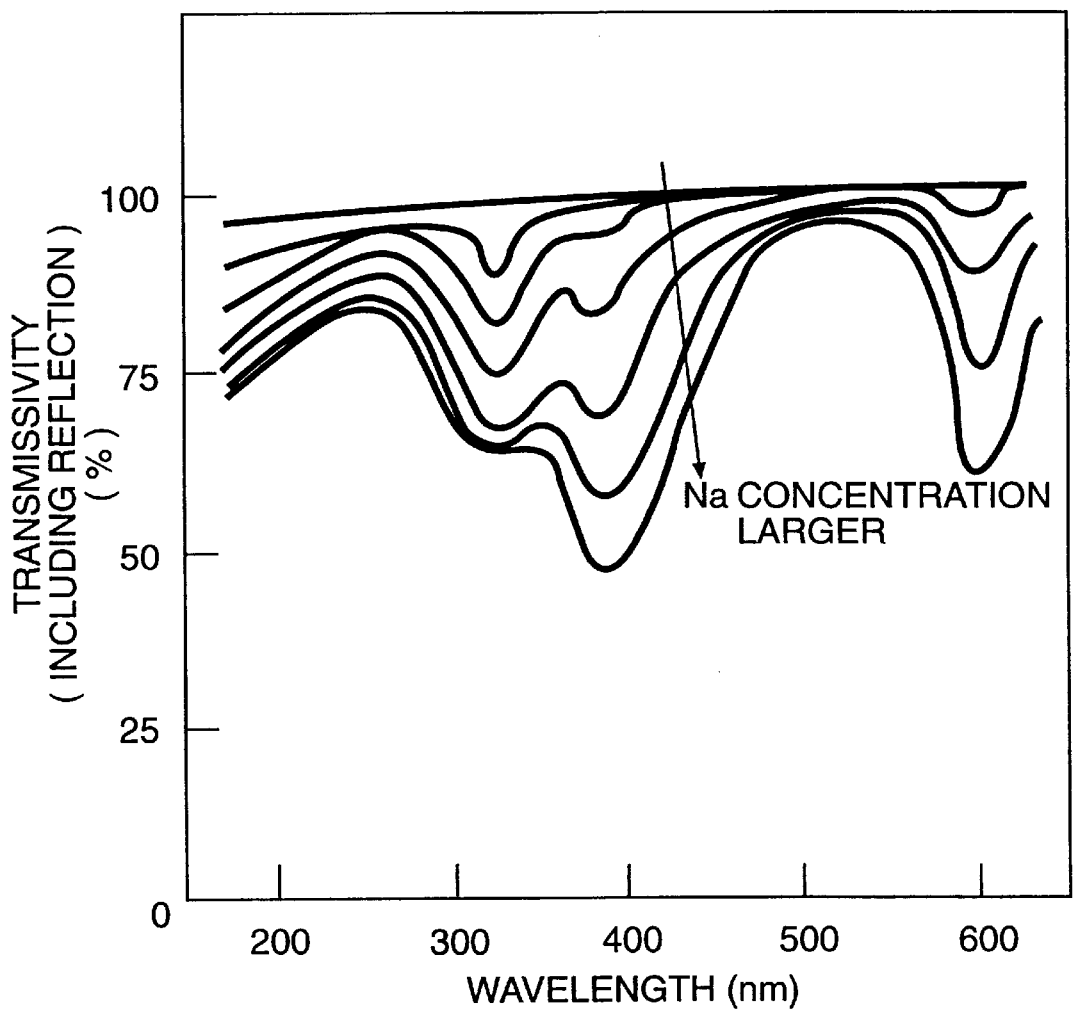
FIG. 5 shows the transmissivity versus he wavelength for various calcium fluoride samples after the samples are irradiated by ArF excimer laser pulses of 100 mJ·cm$^{-2}$/pulse by $10^4$ times.

FIG. 5 shows the transmissivity versus the wavelength for various calcium fluoride samples after the samples are irradiated by ArF excimer laser pulses of 100 mJ·$cm^{-2}$/pulse by $10^4$ times. In FIG. 5, the samples exhibiting lower curves have the higher concentrations of Na, as indicated by the arrow. When the concentration of the sodium impurity is small, the absorption peak due to the color centers appears at the vicinity of 325 an. As the concentration of the sodium impurity increases, this absorption peak becomes larger and other absorption peaks appear at the vicinities of 385 nm and 600 nm. When the amount of sodium increases even further, the absorption peak at 325 nm stops increasing. This behavior is considered to be caused by the following reason: the type of color centers changes with the sodium concentration so that the resultant absorption band changes.

Among these three absorption bands, the peak at 325 nm has he greatest effect on be transmissivity at 193 nm. Accordingly, it can be concluded that when the sodium concentration is below a certain threshold value, the sodium concentration has a significant effect on the transmissivity at 193 nm.

The present inventors discovered that this threshold value of the sodium concentration is approximately 1 ppm, and Equation (2) holds true for the sodium concentration smaller than this value, 1 ppm.

In the present invention, the sodium concentrations in the synthetic silica glass and calcium fluoride crystals were measured by activation analysis, which allows analysis of very small quantity of object atoms. In activation analysis, qualitative and quantitative analyses are performed by irradiating target atoms with neutron radiation to cause the decay of the stable atomic nuclei of the target atoms to produce unstable isotopes. The radiation generated by these atomic nuclei is then measured. In most other analytical methods, changes in electronic states or energies are measured. Accordingly, the chemical start is easily affected by the pretreatment of the sample, or the like. Activation analysis, however, acts directly on atomic nuclei, and therefore has an advantages in that the chemical state does not suffer from the measurement.

The detection limit for the Na concentration in synthetic silica glass and calcium fluoride crystals by activation analysis was 0.001 ppm. Furthermore, the concentrations of other metal impurities were measured using inductive coupling type plasma emission spectroscopy.

Calcium fluoride crystals according to the present invention were subject to irradiation tests using an ArF excimer laser beam i.e., durability tests against ArF excimer laser beam were performed. It was found that changes in the transmissivity of the calcium fluoride crystals depend on the energy density of the irradiating light, but are independent of the number of the shots. Accordingly, the energy density of irradiation was set at 100 mJ·$cm^{-2}$/pulse, and the number of irradiating pulses was set to $10^4$. If a drop in the transmissivity at 193 nm caused by the irradiation is small, such a result would assure favorable ability of the sample to withstand ArF excimer laser beams.

The transmissivity at the wavelength of an ArF excimer laser (193 nm) was measured using a spectrophotometer "CARYS" manufactured by Varian Co. The calcium fluoride crystal of the present invention showed a drop in the transmissivity of 0.1% or less per unit centimeter of thickness. In other words, the transmissivity of greater than 99.9% per unit centimeter of thickness was achieved. Accordingly, it was confirmed that optical members containing the calcium fluoride crystal of the present invention have a superior durability in that the transmissivity hardly deteriorates even when exposed to a large amount of ArF excimer laser beans.

Figure 4:
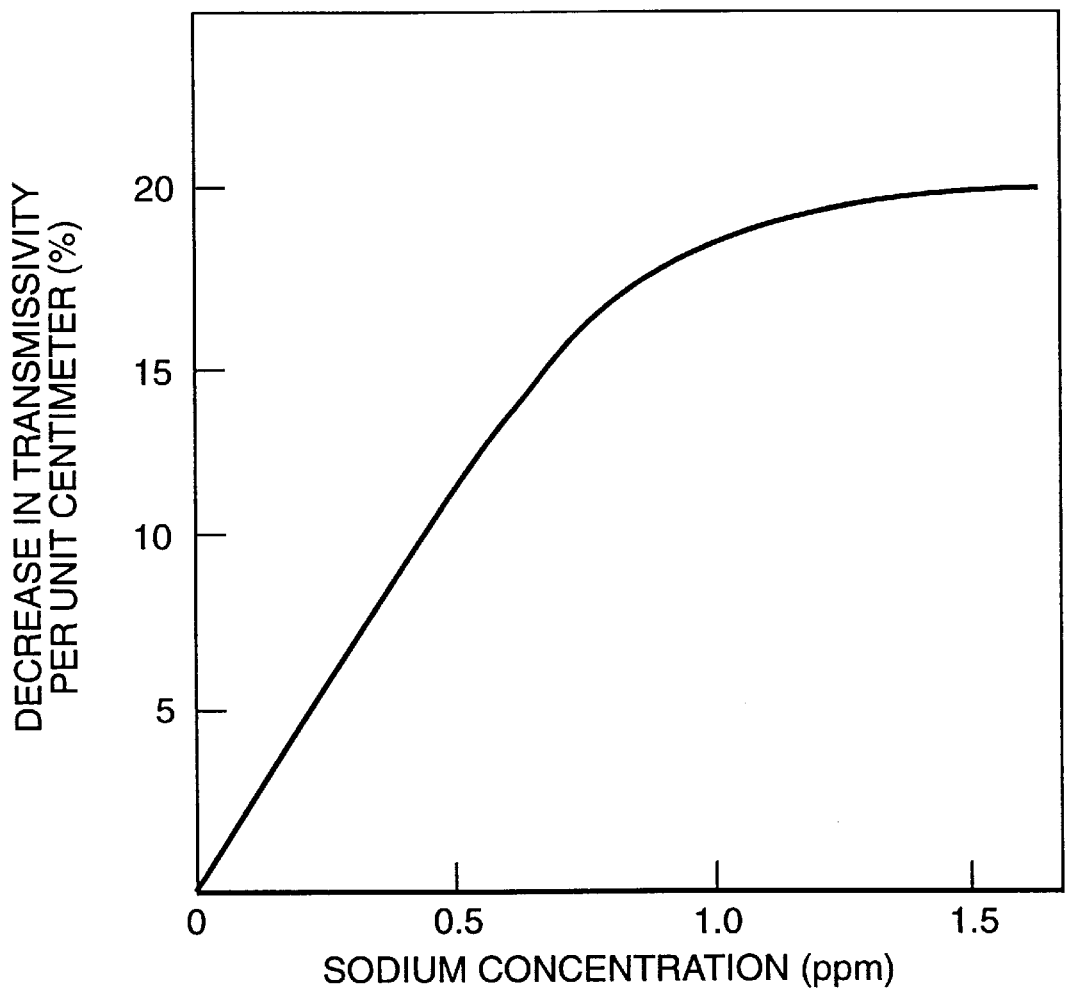
FIG. 4 shows measured data indicating the decrease in transmissivity versus the sodium concentrations for calcium fluoride crystals after $10^4$ pules of the ArF excimer laser beam having an energy density 100 mJ·cm$^{-2}$/pulse irradiates the samples.

Furthermore, a strong correlation between the sodium concentration and the durability against ArF excimer laser bet was found by performing durability tests with respect to ArF excimer laser beams on various calcium fluoride crystals with different sodium concentrations, including conventional calcium fluoride crystals. The results obtained are shown in FIG. 4. In FIG. 4, the horizontal axis indicates the sodium concentration and the vertical axis indicates the decay in the transmissivity in percentage per unit centimeter at the wavelength 193 nm after $10^4$ pules of the ArF excimer laser beam with the energy density 100 mJ·$cm^{-2}$/pulse irradiates the samples. FIG. 4 clearly shows the decay increases linearly for small sodium concentrations According to the results of FIG. 4 and the fact that the drop in transmissivity is proportional to the energy density of the laser bean, the linear region of FIG. 4 can be expressed by the following Equation (4):

$$Y=0.25 \, E[Na], \tag{4}$$

where the drop in transmissivity per unit centimeter of thickness is indicated as Y %, the edgy density is indicated as E mJ·$cm^{-2}$/pulse, and the sodium concentration is indicated as [Na] ppm.

According to this Equation (4), if the energy density of the ArF excimer laser beam is set at a practical maximum value of 100 mJ·cm$^{-2}$/pulse and optical member made of the calcium fluoride crystal needs to have a transmissivity of 99.8% per unit centimeter, for example, the sodium concentration less than 0.008 ppm is necessary.

In the image-focusing optical system of a reduction type projection exposure apparatus, the maximum energy density of the ArF excimer laser beam is typically about 4 mJ·cm$^{-2}$/pulse. Accordingly, if an optical member made of the calcium fluoride crystal needs to have a transmissivity of 99.8% per unit centimeter, The sodium concentration up to about 0.2 ppm is possible, as determined by Equation (4).

Durability tests against a KrF excimer laser beam also was performed using various calcium fluoride crystals having different sodium concentrations. The energy density of irradiation was set at 400 mJ·cm$^{-2}$/pulse, and the number of irradiating pulses was set to $10^4$. No drop in transmissivity occurred in any of the samples. Thus, the absence of any dependence on the sodium concentration for the case of the KrF excimer laser beam was confirmed.

In crystallization methods in which crystallization is performed by solidifying the melt, such as in the Bridgeman method, the concentration $C_S$ of impurities in the resulting crystal is generally smaller than the concentration $C_L$ of the same impurities in the melt. Impurity atoms that are not incorporated into the crystal are discharged into the liquid phase materials at the solid-liquid interface. The impurity concentration $C_0$ at the sold-liquid interface is determined by forming an equilibrium condition between this discharging flow and the diffusive flow of impurity atoms into the solid phase materials due to the concentration gradient. Accordingly, the distribution of the impurity concentration C obeys the following diffusion equation:

$$D_L(d^2C/d\zeta^2)+V(dC/d\zeta)=0. \tag{5}$$

Here, $D_L$ is the diffusion coefficient, V is the growth rate, and $\zeta$ is the coordinate in the direction of the growth with the origin being fixed at the solid-liquid interface. The boundary conditions are follows:

$$C(\delta)=C_L-D_L(dC/d\zeta)_{INTERFACE}=V(C_0-C_S), \tag{6}$$

where $\delta$ is the thickness of the impurity diffusion layer.

The effective segregation coefficient K is determined by analyzing the solid-liquid interface using the equilibrium segregation coefficient k=$C_S/C_0$, as follows.

$$C_S=kC_0, \zeta-0,$$

$$K=C_S/C_L=k/\{k+(1-k)\exp(-V\delta/D_L)\}, \tag{7}$$

It is clearly seen from Equation (7) that lowering the growth rate V has the effect of reducing the effective segregation coefficient $K_S$ thus reducing the concentration $C_S$ of impurities in the crystal However, if the growth rate is greatly lowered in an attempt to reduce the concentration of impurities to be incorporated into the crystal, an extremely long time is required to complete the crystallization of all the melt. In the growth of convention calcium fluoride crystals the main object is to sees the generation of absorption bands caused by bubbles, foreign objects, and lead. That is, there was no need to give careful consideration to the growth rate, i.e., no attention was paid to the extremely so amount of the specific impurity (Na in this case). Accordingly, the growth rate in the conventional art has ordinarily been set at approximately 2 mm/hr.

For the growth of calcium fluoride crystals, the present inventors performed a pre-treatment on a raw material prior to the growth stage in order to produce a high-purity pre-treated material, and then produced a calcium fluoride crystal by performing a growth process using this pre-treated product as a raw material. Through these processes, it was discovered that an efficient growth condition for a calcium fluoride crystal having few impurities Therein can be obtained by optimizing the growth rate of the pre-treatment stage and the growth rate of the growth stage, i.e., the rate at which the crucible is pulled downward.

Specifically, a calcium fluoride crystal with a sodium concentration of 0.2 ppm or less was produced as follows. First, the pre-treatment process was performed by executing the following steps: mixing a high-purity calcium fluoride raw material and a scavenger in a crucible placed in a vacuum heating furnace; performing a reduction reaction; melting the product of the reaction at a temperature higher than the meting point of calcium fluoride; pulling the crucible downward at the rate of 5 mm/hr so that the above-mentioned reaction produce was gradually crystallized from the lower portion of the crucible. These steps produced a pre-treated product. Then the growth process was performed as follows: melting the pre-treated product in a vacuum heating furnace at a temperature higher than the melting point of calcium fluoride, pulling the crucible downward at the rate of 1 mm/hr so that the pre-treated product was gradually crystallized from the lower portion of the crucible.

It can be seen from the above-mentioned Equation (7) that if the effective segregation coefficient K is constant, the concentration $C_S$ of impurities incorporated into the crystal can be lowered by lowering the concentration $C_L$ of impurities in the melt. This method is quite effective because it can be selectively performed with respect to a specific impurity. In actual crystal growth, both the optimization of the growth rate and the lowering of the sodium concentration in the melt were employed in a well balanced manner to maximize the effects.

By taking into consideration that the impurity concentration in the melt rises as crystallization proceeds, the following well-known Equation (8) is derived.

$$C_S=KC_{L0}(1-g)^{(K-1)} \tag{8}$$

where g is the degree of crystallization and $C_{L0}$ is the initial impurity concentration in the melt. Equation (8) predicts that the impurity concentration $C_S$ in the crystal would increase smoothly as crystallization proceeds. However, according to the present inventors studies regarding the growth of calcium fluoride crystals using the vertical Bridgeman method (which is mainly used by the inventors), it was found that the impurity concentration in the crystal increases conspicuously when the degree of crystallization exceeds 0.95, i.e., at the final stage of crystallization. The calcium fluoride crystal of the present invention was grown by utilizing this phenomenon in order to further reduce the sodium concentration.

In general, the main purpose of constructing an image-focusing optical system using two or more different types of optical materials is to correct chromatic aberration However, the present invention can also be applied to an image-focusing optical system constructed of optical members made of silica glass and/or calcium fluoride crystal for correcting monochromatic aberrations (optical aberrations other than chromatic aberration, e.g., distortion).

The image-focusing optical system of the present invention is especially suitable for use in a photolithographic apparatus that uses an ArF excimer laser as a light source. FIG. 1 shows the basic construction of such a photolithographic apparatus.

This apparatus includes a stage 30 for placing a substrate (wafer) W having a photosensitive agent coated thereon on surface 3a, an illumination optical system 10 for uniformly illuminating a mask (reticle) R (having an integrated circuit pattern thereon) with ArF excimer laser light as exposing light. The apparatus also includes a light source 100 for supplying the exposing light the illumination optical system 10, and a projection optical system 50 installed between a first surface P1 (object plane) on which the mask R is disposed, and a second surface P2 (image plane) that coincides with the surface of the substrate W, for reducing and projecting the pattern of the mask R onto the substrate W. The illumination optical system 10 also includes an alignment optical system 110 for adjusting the relative positions of the mask R and the substrate W. Furthermore, the mask R is installed on a reticle stage 20 which can move in a direction parallel to the surface of the wafer stage 30. Article loading/unloading system 200 replaces and conveys reclines R held on the reticle stage 20. The reticle loading/unloading system 200 includes a stage driver for moving the reticle stage parallel to the surface 3a of the wafer stage 30. The projection optical system 50 also has an additional alignment optical system used for a scanning type apparatus.

The projection exposure apparatus of the present invention includes not only an exposure apparatus of scanning type in which the mask pattern is posed while the mask and substrate are moved in synchronization with each other, but also a step-and-repeat type exposure apparatus in which the pattern of the mask is exposed with the mask and substrate in respective stationary states, and the substrate is moved stepwise to change the shot area.

Light sources that can be used in the image-focusing optical system and/or projection exposure apparatus of the present invention include light sources that can emit light in the ultraviolet or vacuum ultraviolet regions (at 300 nm or less). The examples are KrF excimer lasers (248 nm), ArF excimer lasers (193 nm), and $F_2$ lasers (157 nm), etc.

When synthetic silica glass is used in the vacuum ultraviolet band as in the case of an F2 laser, etc., the initial transmissivity drops if the concentration of OH groups is high. Therefore, glass with a low concentration of OH groups, e.g., 10ppb to 20 ppb, is used. For the ordinary ultraviolet region, the presence of OH groups has the effects of stabilizing the structure and improving the durability. Thus, OH groups are in this case intentionally included in the glass within tee range of 10 ppb to 100 ppm. Furthermore, fluorine or oxygen is sometimes included in silica glass in order to improve the durability at shorter wavelengths. Such silica glass can also be used in the present invention Furthermore, projection optical systems, to which the present invention can be applied, includes systems disclosed in Japanese Patent Applications No. 8-255505, No. 8-179881, and No. 8-1 75925. Moreover, illumination optical systems, to which the present invention can be applied, includes systems disclosed in U.S. patent application Ser. No. 081667606.

The image-focusing optical system of the present invention car be used as the above-mentioned illumination optical system 10 and/or the above-mentioned projection optical system 50 of FIG. 1. When the image-focusing optical system of the present invention is used as an illumination optical system, it is desirable that the sodium concentration in the respective optical members made of silica glass and/or calcium fluoride crystals be about 0.01 ppm or less. On the other hand, when the image-focusing optical system of the present invention is used as a projection optical system, it is desirable that the sodium concentration in the respective optical members made of silica glass and/or calcium fluoride crystals be about 0.1 ppm or less. This difference in the permissible sodium concentrations steins from the fact that the illumination on optical system is closer to the light source than the projection optical system, and accordingly the lenses in the illumination optical system are irradiated with light having a relatively narrow beam width. Therefore, the energy density of the light striking the respective lens members is higher, thereby requiring higher durability against ArF excimer laser beams.

Using the image-focusing optical system of the present invention as the illumination optical system and/or projection optical system in a photolithographic apparatus using an ArF excimer laser as a light source, it becomes possible to realize a high-performance photolithographic apparatus, which has been difficult to construct using conventional technology.

Below, the present invention will be described in more detail by showing additional preferred embodiments and working examples of the present invention. However, the image-focusing optical system according to the present invention is not limited to these examples.

First Manufacturing Method for Calcium Fluoride Crystal

An example of the method for manufacturing the calcium fluoride crystal of the present invention will be described below.

As a first stage, a pre-treatment was performed to purify raw materials. In addition to known oxygen, contamination of foreign substances, such as sodium, which is the most important impurity according to the present invention, needs to be carefully controlled. A vacuum heating apparatus capable of performing a vertical Bridgeman method was used as the pre-treatment apparatus. A carbon vessel, which had received a high-purifying treatment, was placed in the pre-treatment apparatus. The interior of the pre-treatment apparatus was evacuated to $10^{-6}$ Torr using an oil diffusion pump equipped with a liquid nitrogen cold trap. The pre-treatment apparatus was equipped with a heater capable of electric current heating, so hat the temperature in the apparatus can be controlled by PID control.

First, the temperature was gradually elevated to 1550 C., which was more than 100° C. higher than the maximum temperature in the growth process (second stage), maintained at this value for 120 hours, and was then lowered to the room temperature. This cleaning process by the heat treatment is referred to as "baking." Besides the carbon vessel, this baking cleans the entire interior of the pre-treatment apparatus including the heater and heat-insulating materials, etc. The pressure inside the pre-treatment apparatus after the heat treatment was as low as $10^{-7}$ Torr, indicating that the cleaning was successful, Next, 0.1 mol % of powdered lead fluoride with high purity was added to powdered calcium fluoride raw material with high purity, and these ingredients were thoroughly mixed The carbon vessel cleaned by baking was then filled with i mixture. The carbon vessel was placed in a prescribed position in the pre-treatment apparatus, and the apparatus was evacuated to $10^{-5}$ Torr. The temperature in the pre-treatment apparatus was gradually elevated, and a reduction reaction was personnel for 24 hours at 900° C. This reduction reaction was performed according to the following reaction equation: $CaO+PbF_2 \rightarrow CaF_2+PbOT$. After the reduction reaction process, the temperature was further elevated to 1420° C., and the homogeneous viscosity and the homogeneous distribution of the components of the melt were obtained by maintaining the temperature for 24 hours. Then, crystallization was initiated by pulling the vessel downward. The rate at which the carbon vessel as pulled downward, i.e., the growth rate, was maintained at 3 mm/hr until the entire melt was crystallized. After the entire raw material was crystallized, the uppermost 15 mm of the resultant ingot, which had a relatively high sodium concentration, was cut off, and the rest of the ingot was being used as a bulk raw material for the next growth step. This completed the pre-treatment operation.

Here, since there is no need to maintain the growth rate at a fixed value for the uppermost 15 mm portion of the ingot, the efficiency can be improved by initiating the temperature lowering process immediately after reaching this portion When the sodium concentration was measured by activation analysis using a portion of the bulk raw material as a sample, the measured concentration was less than 0.5 ppm. Since the growth rate in this first stage can be relatively fast (3 mm/hr) as compared to the growth rate in the subsequent actual growth process, a large number of the bulk raw material ingots can be produced in a relatively short time.

As a second stage, the growth process of the calcium fluoride crystal of the present invention was performed using a vertical Bridgeman method in vacuum. The bulk raw material produced above was accommodated by a carbon crucible cleaned by baking, and this crucible was placed in a growth apparatus which had been subject to baking. The growth apparatus was evacuated to $10^4$ Torr, and temperature was elevated by electric current beating of a heater. The temperature was gradually elevated to 1420° C. in a controlled manner, and was maintained at that temperature for 24 hours so that the melt was homogenized. Thereafter, crystallization was performed by pulling the crucible downward at a growth rate of 1 mm/hr After all of the melt was crystallized, the temperature was lowered to the room temperature, The sodium concentration was measured for a portion of the thus produced ingot as a sample, the measured result was less Man 0.008 ppm. Furthermore, a durability test against ArF excimer laser beams was performed by irradiating the portion of the ingot with $10^4$ pulses of an ArF excimer laser beam at an energy density of 100 mJ·cm$^{-2}$/pulse. The measured decrease in transmissivity after the irradiation was less Can 0.2% per unit centimeter. In other words, a transmissivity of 99.8% per unit centimeter or greater was maintained.

Second Manufacturing Method for Calcium Fluoride Crystal

A calcium fluoride crystal of the present invention suitable for projection lenses for light having a relatively small energy density was manufactured, as follows.

As a first stage, a pre-treatment was performed to purify the raw material in a similar manner to above. However, the baking duration was set at 8 hours, and the growth rate was set to 5 mm/hr. These conditions are permissible since the relatively high impurity concentration is allowed in the crystal in this case. The thickness of the upper portion of the ingot to be removed may be 10 mm but is preferably 15 mm. The measured sodium concentration in the bulk raw material thus manufactured was less than 1 ppm. Since the growth rate in this first stage is relatively fast: 5 mm/hr, even more efficient manufacture is possible.

The growth rate in the second stage was set at 1 mm/hr. When the sodium content was measured for a portion of the ingot thus manufactured as a sample, the measured sodium concentration was less than 0.2 ppm. A durability test against an ArF excimer laser beam was performed by irradiating the sample with $10^4$ pulses of an ArF excimer laser beam having an energy density of 4 mJ·cm$^{-2}$/pulse, the measured decrease in transmissivity was less than 0.2% per unit centimeter. In other words, a transmissivity of more than 99.8% per unit centimeter was maintained.

First Image-Focusing Optical System

Figure 2:
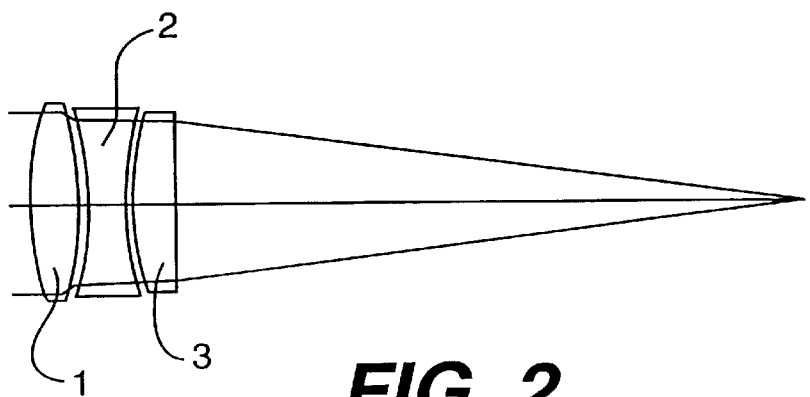
FIG. 2 schematically shows a structure of an image-focusing optical system according to a working example of the present invention.

To demonstrate the effects of the present invention, an image-focusing optical system for an ArF excimer laser was built. The cross-section of the optical system is schematically shown in FIG. 2. Here, reference numerals 1 and 3 indicate lenses made of calcium fluoride crystals, and reference numeral 2 indicates a lens made of synthetic silca glass. The focal length of this image-focusing optical system is 100 mm, and the numerical aperture is 0.125. The curvature radii, center thicknesses and the lens spacings of the respective lens parts are shown in Table 2 below.

TABLE 2

| Lens part No. | Curvature radius (mm) | Thickness (mm) | Lens spacing (mm) |
|---|---|---|---|
| 1 | 45.5 | 7.0 | |
|   | −33.5 |     | 1.0 |
| 2 | −32.1 | 4.0 | |
|   | 39.1 |     | 1.0 |
| 3 | 39.4 | 7.0 | |
|   | −164.5 |     |  |

Furthermore, three comparative examples of the image-focusing optical system having the same dimensions but having different sodium concentrations were prepared for comparison. The Na concentrations of these systems are shown in Table 3. Also, the measured total transmissivities (throughput) of the respective image-focusing optical systems with respect to ArF excimer laser light are shown in Table 3.

TABLE 3

| | Na concentration (ppm) | | Total transmissivity |
|---|---|---|---|
| | Parts No. 1 and 3 | Part No. 2 | (throughput) % |
| Working Example 1 | 0.01 | 0.01 | 99 |
| Comparative Example 1 | 0.01 | 0.2 | 95 |
| Comparative Example 2 | 0.4 | 0.01 | 87 |
| Comparative Example 3 | 0.4 | 0.2 | 84 |

In the evaluations above, the incident energy density of the ArF excimer laser applied to the respective image-focusing optical systems was set to 100 mJ·cm$^{-2}$/pulse and pulse rate was set to 100 Hz. As is clear from Table 3 above, it was confirmed that the total transmissivity (throughput) of the image-focusing optical system constructed using lens members satisfying the Na concentration requirement of less an about 0.2 ppm according to the present invention is much higher than those of other examples.

Second Image-Focusing Optical System and Exposure Apparatus

A projection optical system fox a photolithograpbic apparatus using a ArF excimer laser as a light source (constructed as shown in FIG. 1) was constructed using optical members of the present invention. These optical members were made of silica glass and calcium fluoride crystal and had the following characteristics: the maximum diameter of 250 mm; the thickness of 70 mm; a maximum refractive index difference Δn (in the excimer laser irradiation region) of less than $2 \times 10^{-6}$; and a maximum birefingenace of less than 2 nm/cm.

Figure 3:
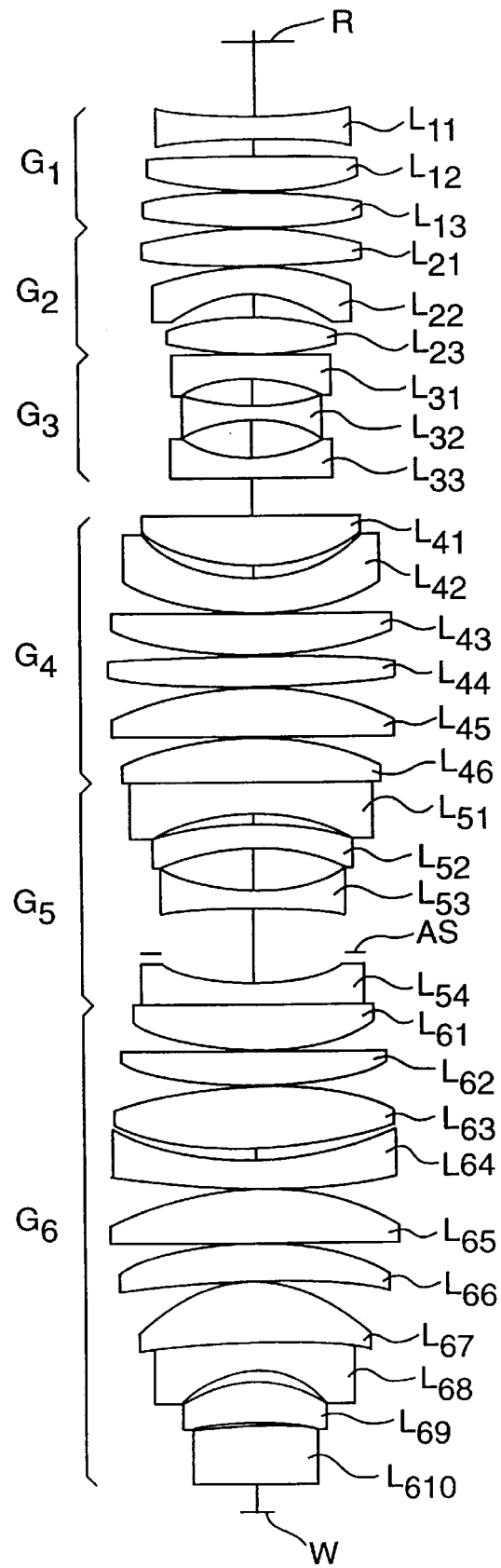
FIG. 3 schematically shows a projection optical system according to another working example of the present invention.

FIG. 3 schematically shows the thus constructed projection optical system for the photolithographic apparatus of FIG. 1. As shown in FIG. 3, the projection optical system of this embodiment (working example) has, in the following order from the reticle R side, a first lens group G1 with a positive power, a second lens group G2 with a positives power, a third lens group G3 with a negative power, a fourth lens group G4 with a positive power, a fifth lens group G5 with a negative power and a sixth lens group G6 with a positive power. Furthermore, this optical system was designed to be substantially telemetric between the objective side (reticle R side) and the image side (wafer W side), and has a predetermined reduction ratio. The N.A. of this projection optical system is 0.6, and the reduction ratio (projection magnification) is ¼

Table 4 shows the specifications of the respective lenses of this projection optical system shown in FIG. 3. In Table 4, numbers in the first column are the numbers of the respective lens surfaces counted from the objective side (reticle R side), Y in the second column indicates the curvature radii of the respective lenses, "d" in the third column indicates the spacing between the adjacent lens surfaces, the chemical formulae in the fourth column indicate the materials of the respective lenses, and the fifth column indicates the lens groups to which the respective lenses belong.

TABLE 4

|   | r | d |   |   |
|---|---|---|---|---|
| 0 | (Reticle) | 103.390978 |   |   |
| 1 | −453.18731 | 17.000000 | SiO$_2$ | G$_1$ |
| 2 | 370.52697 | 13.613089 |   |   |
| 3 | 710.84358 | 26.000000 | SiO$_2$ | G$_1$ |
| 4 | −350.78200 | 1.000000 |   |   |
| 5 | 367.53957 | 28.000000 | SiO$_2$ | G$_1$ |
| 6 | −567.47540 | 1.000000 |   |   |
| 7 | 289.50734 | 29.000000 | SiO$_2$ | G$_2$ |
| 8 | −899.09021 | 1.000000 |   |   |
| 9 | 199.45895 | 23.000000 | SiO$_2$ | G$_2$ |
| 10 | 103.61200 | 15.764153 |   |   |
| 11 | 188.56105 | 25.800000 | SiO$_2$ | G$_2$ |
| 12 | −574.20881 | 4.242446 |   |   |
| 13 | 3000.00000 | 16.616840 | SiO$_2$ | G$_3$ |
| 14 | 118.18165 | 21.762847 |   |   |
| 15 | −336.11504 | 15.000000 | SiO$_2$ | G$_3$ |
| 16 | 161.39927 | 25.871656 |   |   |
| 17 | −120.57109 | 15.000000 | SiO$_2$ | G$_3$ |
| 18 | ∞ | 33.995810 |   |   |
| 19 | −2985.44349 | 36.979230 | SiO$_2$ | G$_4$ |
| 20 | −150.10550 | 11.683590 |   |   |
| 21 | −122.25791 | 28.000000 | SiO$_2$ | G$_4$ |
| 22 | −204.99200 | 1.000000 |   |   |
| 23 | ∞ | 29.240000 | SiO$_2$ | G$_4$ |
| 24 | −312.57215 | 1.000000 |   |   |
| 25 | 965.45342 | 27.000000 | SiO$_2$ | G$_4$ |
| 26 | −643.40298 | 1.000000 |   |   |
| 27 | 258.67450 | 39.000000 | CaF$_2$ | G$_4$ |
| 28 | −2967.14698 | 1.000000 |   |   |
| 29 | 246.35328 | 35.000000 | CaF$_2$ | G$_4$ |
| 30 | −2970.04481 | 1.000000 |   |   |
| 31 | ∞ | 24.000000 | SiO$_2$ | G$_5$ |
| 32 | 157.63171 | 10.667015 |   |   |
| 33 | 234.15227 | 17.000000 | SiO$_2$ | G$_5$ |
| 34 | 157.66180 | 32.592494 |   |   |
| 35 | −200.72428 | 15.000000 | SiO$_2$ | G$_5$ |
| 36 | 432.89447 | 37.939196 |   |   |
| 37 | (Aperture diaphragm) | 24.400000 |   |   |
| 38 | −175.71116 | 17.000000 | SiO$_2$ | G$_5$ |
| 39 | −2985.98357 | 1.000000 |   |   |
| 40 | −2985.99700 | 35.500000 | CaF$_2$ | G$_6$ |
| 41 | −189.63629 | 1.000000 |   |   |
| 42 | −3000.00000 | 24.400000 | SiO$_2$ | G$_6$ |
| 43 | −350.29744 | 1.000000 |   |   |
| 44 | 362.38815 | 46.500000 | CaF$_2$ | G$_6$ |
| 45 | −361.31567 | 10.870000 |   |   |
| 46 | −251.97148 | 23.000000 | SiO$_2$ | G$_6$ |
| 47 | −662.28158 | 1.000000 |   |   |
| 48 | 238.98700 | 38.100000 | CaF$_2$ | G$_6$ |
| 49 | 1994.63265 | 1.000000 |   |   |
| 50 | 211.51173 | 33.400000 | CaF$_2$ | G$_6$ |
| 51 | 720.00000 | 1.000000 |   |   |
| 52 | 129.92966 | 46.000000 | CaF$_2$ | G$_6$ |
| 53 | 669.85166 | 2.783304 |   |   |
| 54 | 970.74182 | 19.986222 | SiO$_2$ | G$_6$ |
| 55 | 78.20244 | 6.273142 |   |   |
| 56 | 86.12755 | 32.522737 | SiO$_2$ | G$_6$ |
| 57 | 230.00000 | 2.862480 |   |   |
| 58 | 232.22064 | 44.183443 | SiO$_2$ | G$_6$ |
| 59 | 350.03691 | 19.466219 |   |   |
| 60 | (Wafer) |   |   |   |

In the present embodiment, silica glass and calcium fluoride crystals having the Na concentrations of 0.03 ppm and 0.1 ppm, respectively, were used to create the respective optical elements of Table 4.

The measured total transmissivity (throughput) of the projection optical system thus constructed reached more than 80% Furthermore, the resultant resolution of the projection optical system was 0.19 μm for line-and-space patterns. Therefore, an ArF excimer laser stepper having a superior image-focusing performance was obtained.

As described above, the present invention provides silica glass optical members and calcium fluoride optical members suitable for the construction of optical systems that have large imaging focusing areas and that have superior total transmissivities with respect to light in ultraviolet and vacuum ultraviolet bands below the wavelength of 200 nm and with respect to laser beams in like wavelength bands. Such optical systems can be installed in an excimer laser photolithography apparatus, for example. The present invention also provides optical elements, such as fibers, window members, mirrors, etalons and prisms, etc., which have the superior total transmissivities (throughput) with respect to light in ultraviolet and vacuum ultraviolet bands below the wavelength of 250 nm and with respect to laser beams in like wavelength bands. Furthermore, according to the present invention, it became possible to construct a high-precision photolithographic apparatus using an ArF excimer laser of a wavelength of 193 nm by providing superior image-focusing opt systems.

It will be apparent to those skilled in the art that various modifications and variations can be made in the image-focusing optical system for ultraviolet laser of the present invention without departing from the spirit or scope of the invention. Thus, it is intended that the present invention cover the modifications and variations of his invention provided they come within the scope of the appended claims and their equivalents.

What is claimed is:

1. An optical member for use in an image-focusing optical system for guiding light having a wavelength shorter than about 300 nm, the optical member comprising a calcium fluoride crystal having a sodium concentration of less in about 0.2 ppm.

2. The optical member according to claim 1, wherein the calcium fluoride crystal has a sodium concentration of less than about 0.1 ppm.

3. The optical member according to claim 1, wherein the calcium fluoride crystal has a sodium concentration of less than about 0.01 ppm.

4. The optical member according to claim 1, wherein a decrease in bulk transmissivity of the optical member at a wavelength of 193 nm after the optical member is irradiated with more than about $10^4$ pulses of an ArF excimer laser beam with an energy density of 100 mJ·cm$^{-2}$ per pulse is less than about 5% per unit centimeter.

5. A image-focusing optical system for guiding light having a wavelength shorter than about 300 nm, the image-focusing optical system comprising:

a first optical member including a calcium fluoride crystal having a sodium concentration of less than about 0.2 ppm; and a second optical member optically coupled to the fist optical member, the second optical member including silica glass having a sodium concentration of less than about 0.2 ppm.

6. The image-focusing optical system according to claim 5, wherein the sodium concentration of the calcium fluoride crystal in the first optical member is less than about 0.1 ppm, and the sodium concentration of the silica glass in the second optical member is less than about 0.1 ppm.

7. The image-focusing optical system according to claim 5, wherein the sodium concentration of the calcium fluoride crystal in the first optical member is less than about 0.01 ppm, and the sodium concentration of the silica glass in the second optical member is less than about 0.01 ppm.

8. The image-focusing optical system according to claim 5, wherein the sodium concentration of the calcium fluoride crystal in the first optical member is less than about 0.1 ppm, and the sodium concentration of the silica glass in the second optical member is less than about 0.03 ppm.

9. The image-focusing optical system according to claim 5, further comprising a light source emitting the light having the wavelength shorter than about 300 nm towards at least one of the first and the second optical members.

10. The image-focusing optical system according to claim 9, wherein the light source includes an ArF excimer laser.

11. An illumination optical system for use in an exposure apparatus to guide light having a wavelength shorter than about 300 nm towards a mask, the illumination optical system comprising:

a first optical member including a calcium fluoride crystal having a sodium condensation of less than about 0.1 ppm; and a second optical member optically coupled to the first optical member, the second optical member including silica glass having a sodium concentration of less than about 0.1 ppm.

12. The illumination system according to claim 11, wherein the sodium concentration of the calcium fluoride crystal in the first optical member is less than about 0.01 ppm, and the sodium concentration of the silica glass in the second optical member is less than about 0.01 ppm.

13. A projection optical system for use in an exposure apparatus to project a circuit pattern on a reticle onto a substrate with light having a wavelength shorter than about 300 nm, projection optical system comprising:

a first optical member including a calcium fluoride crystal having a sodium concentration of less than about 0.1 ppm; and a second optical member optically coupled to the first optical member, the second optical member including silica glass having a sodium concentration of less than about 0.1 ppm.

14. A projection exposure apparatus for projecting a mask pattern on a mask onto a substrate with exposing light having a wavelength shorter than about 300 nm, the projection exposure apparatus comprising:

an illumination optical system for guiding the exposing light towards the mask; and a projection optical system for guiding the exposing light that has passed thought the mask towards the substrate to project the mask pattern onto the substrate, wherein at least one of the illumination optical system and the projection optical system comprises:

a first optical member including a calcium fluoride crystal having a sodium concentration of less than about 0.2 ppm; and a second optical member optically coupled to the first optical member, the second optical member including silica glass having a sodium concentration of less than about 0.2 ppm.

15. The projection exposure apparatus according to claim 14, wherein each of the illumination optical system and the projection optical system comprises a first optical member and a second optical member, and wherein the sodium concentrations in the first optical member and the second optical member in each of the illumination and projection optical systems are less than about 0.1 ppm.

16. The projection exposure apparatus according to claim 14, wherein each of the illumination optical system and the projection optical system comprises a first optical member and a second optical member, and wherein the sodium concentrations in the first and second optical members in the illumination optical system are less than about 0.01 ppm, and the sodium concentrations of the first and second optical members in the projection optical system are less than about 0.1 ppm.

17. The projection exposure apparatus according to claim 14, wherein each of the illumination optical system and the projection optical system comprises a first optical member and a second optical member, and wherein the sodium concentration in the first optical members in the illumination optical system is less than that in the first optical member in the projection optical system.

18. A calcium fluoride crystal to be cut out to form an optical member for processing a pulsed ArF excimer laser beam of a wavelength of 193 nm, wherein a sodium concentration Na in the calcium fluoride crystal in the unit of ppm and a transmissivity drop Y % per unit centimeter determined by a difference between an initial transmissivity and a terminal transmissivity to which a transmissivity of the calcium fluoride crystal for the pulsed ArF excimer laser beam approaches when the calcium fluoride crystal is irradiated with a sufficient number of pulses of the pulsed ArF excimer laser beam having an energy density E mJ·cm$^{-2}$ per pulse substantially satisfy the following equation, $$Na = \frac{Y}{0.25 \cdot E},$$

and wherein Na is less than about 0.2 ppm.

19. An optical member for processing a pulsed ArF excimer laser beam of a wavelength of 193 nm, the optical member comprising a calcium fluoride crystal, wherein a sodium concentration Na in the calcium fluoride crystal in the unit of ppm and a transmissivity drop Y % per unit centimeter determined by a difference between an initial transmissivity and a terminal transmissivity to which a transmissivity of the calcium fluoride crystal for the pulsed ArF excimer laser beam approaches when the calcium fluoride crystal is irradiated with a sufficient number of pulses of the pulsed ArF excimer laser beam having an energy density E mJ·cm$^{-2}$ per pulse substantially satisfy the following equation, $$Na = \frac{Y}{0.25 \cdot E},$$

and wherein Na is less than about 0.2 ppm.

* * * * *

UNITED STATES PATENT AND TRADEMARK OFFICE
CERTIFICATE OF CORRECTION

PATENT NO.     : 6,061,174
DATED          : May 9, 2000
INVENTOR(S)    : Masaki Shiozawa et al.

It is certified that error appears in the above-identified patent and that said Letters Patent is hereby corrected as shown below:

Column 20, claim 5,
Line 65, delete "A" and insert -- An --

Column 21, claim 5,
Line 4, delete "fist" and insert -- first --

Column 21, claim 11,
Line 33, delete "condensation" and insert -- concentration --

Column 21, claim 14,
Line 61, delete "though" and insert -- through --

Signed and Sealed this

Second Day of April, 2002

*Attest:*

JAMES E. ROGAN
*Attesting Officer*      *Director of the United States Patent and Trademark Office*